United States Patent [19]

Hayashi et al.

[11] Patent Number: 4,651,674
[45] Date of Patent: Mar. 24, 1987

[54] APPARATUS FOR VAPOR DEPOSITION

[75] Inventors: Hisao Hayashi; Yasushi Morita; Mitsunari Noda, all of Kanagawa, Japan

[73] Assignee: Sony Corporation, Tokyo, Japan

[21] Appl. No.: 798,295

[22] Filed: Nov. 15, 1985

[30] Foreign Application Priority Data

Nov. 16, 1984 [JP] Japan .................................. 59-241917
Nov. 16, 1984 [JP] Japan .................................. 59-241918

[51] Int. Cl.$^4$ ............................................. C23C 16/00
[52] U.S. Cl. .................................... 118/728; 118/620
[58] Field of Search ................ 118/728, 620; 427/45.1

[56] References Cited

U.S. PATENT DOCUMENTS 3,796,182  3/1974  Rosler ........................... 118/728 X
3,980,854  9/1976  Berkman et al. .............. 118/728 X
4,394,401  7/1983  Shioya et al. ................. 427/45.1 X
4,468,283  8/1984  Ahmed ........................... 118/728 X Primary Examiner—Bernard D. Pianalto

[57] ABSTRACT

A method and apparatus for depositing a film on a wafer type substrate by vapor deposition. A planar, plate-like susceptor is positioned in a reaction chamber at an angle which is inclined with respect to the horizontal. The wafer is heated to a deposition temperature by means of a radio frequency induction coil which is positioned in close proximity to the susceptor, on the opposite side thereof. A gas inlet means is provided to introduce a decomposable compound of the film to be deposited. The gas inlet means is preferably angularly adjustable relative to the susceptor and is also rotatable on its own axis. Large diameter wafers can be effectively processed with this system in a compact apparatus.

6 Claims, 2 Drawing Figures

APPARATUS FOR VAPOR DEPOSITION

BACKGROUND OF THE INVENTION

1. Field of the Invention

The present invention is in the field of vapor deposition apparatus, employing a plate type susceptor for supporting a wafer on which a film is to be grown. A radio frequency heating unit applies heat to the wafer while the wafer is supported on the susceptor. The temperature of the wafer is sufficient to cause a chemical reaction to occur in the reaction gas which is fed into the chamber, causing the formation of a film on the surface of the wafer.

2. Description of the Prior Art

Conventional vapor deposition methods and apparatus are classified essentially into the vertical type and the barrel type vapor deposition systems.

In the vertical type vapor deposition apparatus, a susceptor is horizontally disposed in a bell jar, a radio frequency induction coil is arranged below the susceptor, and a reaction gas supply nozzle extends through the centers of the susceptor and the coil. With this arrangement, the susceptor is rotated with respect to the nozzle during the vapor deposition.

In a barrel type vapor deposition apparatus, a susceptor in the form of a hexagonal cone is disposed in a bell jar and a lamp for heating the susceptor by radiation heat is disposed outside the bell jar. A reaction gas supply port is arranged at an upper portion of the bell jar. With this type of arrangement, the susceptor is rotated with respect to the bell jar during the vapor deposition process.

With increased diameter wafers used in the conventional vertical type vapor deposition apparatus, the diameters of the susceptor and the bell jar are necessarily increased, thus increasing the installation area of the apparatus.

Also, in the conventional barrel type vapor deposition apparatus, the apparatus as a whole becomes bulky when the wafer size is increased. As a result, maintenance becomes cumbersome, and the evacuation time is prolonged, thus prolonging the production cycle. Radiation heating by the lamp also has a low power efficiency as compared with radio frequency induction heating. Furthermore, since the susceptor comprises a hexagonal cone, it is difficult to improve productivity by automating the wafer loading.

SUMMARY OF THE INVENTION

The present invention provides a vapor deposition apparatus and method including a means for defining a reaction chamber, and support means disposed within the chamber. A platelike susceptor is supported by the support means at an angle which is non-perpendicular to the horizontal. A radio frequency induction coil is disposed behind the susceptor to transfer heat through the same. An article support means is provided for supporting an article to be treated against the susceptor. A gas inlet means directs a reaction gas onto an article supported on the support means, and the temperature of the article is raised sufficiently high by means of the induced radio frequency currents that the vaporous compound contained in the atmosphere is decomposed and a layer of the wafer material is deposited on the surface of the wafer.

In one improved form of the invention, the apparatus includes a gas inlet means which is angularly adjustable relative to the susceptor, and includes an inlet conduit which is rotatable about its axis.

In another preferred form of the invention, the support means for the wafer includes a pair of spaced holding pins on the susceptor. The base support means is preferably in the form of an inverted V, with the radio frequency induction coil and the susceptor being disposed on opposite sides of one leg of the V. The radio frequency induction coil is in the form of a flat spiral.

In the vapor deposition apparatus of the present invention, since the susceptor comprises a plate-like member which is inclined with respect to the horizontal direction, a large diameter wafer can be supported on the susceptor in a small area, thus achieving a compact apparatus. Since the vapor deposition apparatus as a whole can be made compact, maintenance can be simplified, the evacuation time can be shortened, and the production cycle is shortened. As a result, the productivity of the apparatus is improved.

Since the susceptor includes a plate type member, wafer loading can be easily automated so that productivity can be improved as compared with a case of a hexagonal cone as a susceptor.

With the radio frequency induction coil located behind the wafer support surface, the heating power efficiency can also be improved.

DESCRIPTION OF THE PREFERRED EMBODIMENTS

Figure 1:
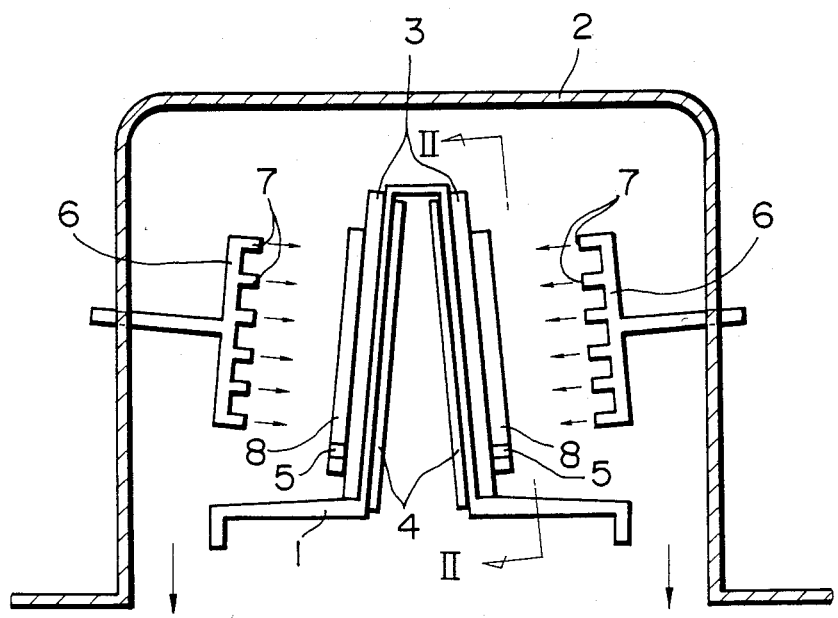
FIG. 1 is a side sectional view, partly in elevation and partly in cross section, of a vapor deposition apparatus according to a preferred embodiment of the present invention.
Figure 2:
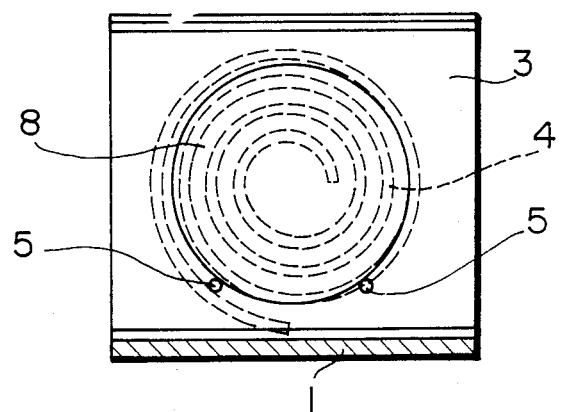
FIG. 2 is a cross-sectional view of the apparatus taken substantially along the line II-II of FIG. 1.

As shown in FIGS. 1 and 2, the vapor deposition apparatus includes an inverted V-shaped base 1 contained in a quartz bell jar 2. The interior of the bell jar 2 defines a reaction chamber for the deposition. The base 1 serves as a coil cover and as a susceptor holder.

A pair of plate-like susceptors 3 composed of graphite or the like are mounted on the legs of the V of the base 1. Radio frequency induction coils 4 in the form of flat spirals are positioned inside the base 1 at positions corresponding to the location of the susceptors 3. Two support pins 5 extend near the lower end of each susceptor 3 for supporting the wafers being treated thereon.

A pair of nozzle assemblies 6 is arranged inside the quartz bell jar 2. Each nozzle 6 has a number of apertures or jets 7 in opposing relation to substantially the entire surface of the corresponding susceptor 3. The inclination of the nozzle 6 can be adjusted with respect to the corresponding susceptor 3, and the nozzle itself has an inlet conduit which can be rotated about its axis.

In order to perform the vapor deposition in the apparatus described above, wafers 8 are supported by the two pins 5 on the corresponding susceptors 3. The wafers 8 are thus in intimate contact with the susceptors 3 and are subjected to induced radio frequency currents from the radio frequency coils 4 located on the opposite side of the leg of the V-shaped base from the plate type susceptors 3.

The angular adjustment of the nozzles 6 with respect to the susceptors 3 is arranged such that the axes of the nozzles 6 are substantially perpendicular to the corresponding susceptors 3. The RF induction coils 4 are energized to heat the wafers 8 through the base 1 and the susceptors 3. As this occurs, the nozzles 6 can be rotated about their axes, and the reaction gas consisting of a mixture of a decomposable compound of the material to be deposited on the wafer in combination with hydrogen gas as a carrier are supplied from the apertures 7.

The chemical decomposition reaction takes place within the chamber and a film of the desired material is grown on the surface of the wafers 8. The reacted and unreacted reaction gases together with hydrogen gas as a carrier are directed downwardly and exhausted outside the quartz bell jar 2 through a gap which exists between the quartz bell jar 2 and the base 1, as indicated by the vertical arrows.

In the vapor deposition apparatus described above, since the nozzles 6 supplying the reaction gas can be angularly adjusted with respect to the corresponding susceptors 3 and since they can be rotated about their axes, the reaction gas can be uniformly sprayed onto the wafers 8 and hence high quality products having deposited films of uniform thickness can be produced.

It will be understood that various modifications can be made to the described embodiments without departing from the scope of the present invention.

We claim as our invention:

1. A vapor deposition apparatus comprising:
    means defining a reaction chamber,
    support means disposed within said chamber, said support means having support surfaces which are convergingly inclined to each other,
    a pair of plate-like susceptors each supported by said support surfaces at a non-perpendicular angle to the horizontal,
    a pair of radio frequency induction coils, one disposed behind each of said support surfaces on the side of said support means opposite from the side supporting said susceptors,
    article support means for supporting an article to be treated against said susceptor, and
    gas inlet means arranged to direct a reaction gas onto an article supported on said support means to thereby generate a vapor deposited layer on said article.

2. An apparatus according to claim 1 wherein said gas inlet means is angularly adjustable relative to said susceptor.

3. An apparatus according to claim 1 wherein said gas inlet means includes an inlet conduit rotatable about its axis.

4. An apparatus according to claim 1 wherein said article support means includes a pair of spaced article holding pins on said susceptor.

5. An apparatus according to claim 1 in which said support means is in the form of an inverted V, with the radio frequency induction coil and the susceptor being disposed on opposite sides of one leg of said V.

6. An apparatus according to claim 1 wherein said radio frequency induction coil is in the form of a flat spiral.

* * * * *